US012604778B2

(12) United States Patent
Iwamoto

(10) Patent No.: US 12,604,778 B2
(45) Date of Patent: Apr. 14, 2026

(54) ELECTRONIC DEVICE

(71) Applicant: Murata Manufacturing Co., Ltd.,
Nagaokakyo (JP)

(72) Inventor: Takashi Iwamoto, Nagaokakyo (JP)

(73) Assignee: MURATA MANUFACTURING CO.,
LTD., Kyoto (JP)

( * ) Notice: Subject to any disclaimer, the term of this
patent is extended or adjusted under 35
U.S.C. 154(b) by 377 days.

(21) Appl. No.: 18/207,170

(22) Filed: Jun. 8, 2023

(65) Prior Publication Data

US 2023/0317690 A1     Oct. 5, 2023

Related U.S. Application Data

(63) Continuation of application No.
PCT/JP2021/045550, filed on Dec. 10, 2021.

(30) Foreign Application Priority Data

Jan. 4, 2021     (JP) ................................. 2021-000077

(51) Int. Cl.
*H01L 23/02* (2006.01)
*H01L 23/00* (2006.01)
(Continued)

(52) U.S. Cl.
CPC .......... *H01L 25/105* (2013.01); *H01L 23/147*
(2013.01); *H01L 23/49811* (2013.01);
(Continued)

(58) Field of Classification Search
CPC ......... B81B 7/0083–0096; H01L 23/34–4735;
H01L 21/4871–4882;
(Continued)

(56) References Cited

U.S. PATENT DOCUMENTS 10,714,455 B2 * 7/2020 Seidemann ............. H01L 24/97
2002/0074146 A1 * 6/2002 Okubora ................. H01L 23/13
                                                                    257/E23.101
(Continued)

FOREIGN PATENT DOCUMENTS

JP        2000114413 A      4/2000
JP        2004134480 A      4/2004
(Continued)

OTHER PUBLICATIONS

International Search Report in PCT/JP2021/045550, mailed Feb. 1,
2022, 4 pages.
(Continued)

*Primary Examiner* — Ismail A Muse
(74) *Attorney, Agent, or Firm* — Keating & Bennett, LLP

(57) ABSTRACT

An electronic device includes a substrate, a base substrate,
a metal connection body, a support body, a metal body, and
a via. The substrate includes one main surface with a
functional element and is a piezoelectric substrate or a
compound semiconductor substrate. The substrate is
mounted on the base substrate such that the one main surface
faces the base substrate. The metal body is in contact with
(Continued)

the support body and includes at least a portion extending to outside the substrate in plan view from the support body. The via connects the portion of the metal body outside the substrate and the base substrate to each other and has a higher thermal conductivity than the substrate.

14 Claims, 5 Drawing Sheets

(51) Int. Cl.
　　*H01L 23/14*　　　　(2006.01)
　　*H01L 23/498*　　　(2006.01)
　　*H01L 25/10*　　　　(2006.01)
(52) U.S. Cl.
　　CPC .. *H01L 23/49827* (2013.01); *H01L 23/49838* (2013.01); *H01L 23/49894* (2013.01); *H01L 24/08* (2013.01); *H01L 24/16* (2013.01); *H01L 2224/08245* (2013.01); *H01L 2224/16245* (2013.01); *H01L 2225/1023* (2013.01); *H01L 2225/1041* (2013.01); *H01L 2225/1058* (2013.01); *H01L 2924/141* (2013.01)
(58) Field of Classification Search
　　CPC ......... H01L 23/36–3738; H01L 23/373–3738; H01L 23/42–4338; H10F 77/60; H10F 77/63–68; F28F 3/00–14; F28F 2013/001; F28F 2255/00–20; F28F 2245/00–08
　　See application file for complete search history.

(56)　　　　　References Cited

U.S. PATENT DOCUMENTS

| | | | | | |
|---|---|---|---|---|---|
| 2006/0180344 | A1* | 8/2006 | Ito | ........................ | H05K 3/4691 |
| | | | | | 174/262 |
| 2015/0201484 | A1 | 7/2015 | Koyanagi | | |
| 2020/0067482 | A1* | 2/2020 | Maki | ...................... | H03H 9/725 |
| 2022/0340802 | A1* | 10/2022 | Lee | .......................... | C09K 5/14 |

FOREIGN PATENT DOCUMENTS

| | | | |
|---|---|---|---|
| JP | 2004327624 | A | 11/2004 |
| JP | 2014154635 | A | 8/2014 |
| JP | 2015133387 | A | 7/2015 |
| JP | 2015162497 | A | 9/2015 |
| JP | 2016127196 | A | 7/2016 |

OTHER PUBLICATIONS

Written Opinion in PCT/JP2021/045550, mailed Feb. 1, 2022, 4 pages.

* cited by examiner

FIG.9
FIG.10
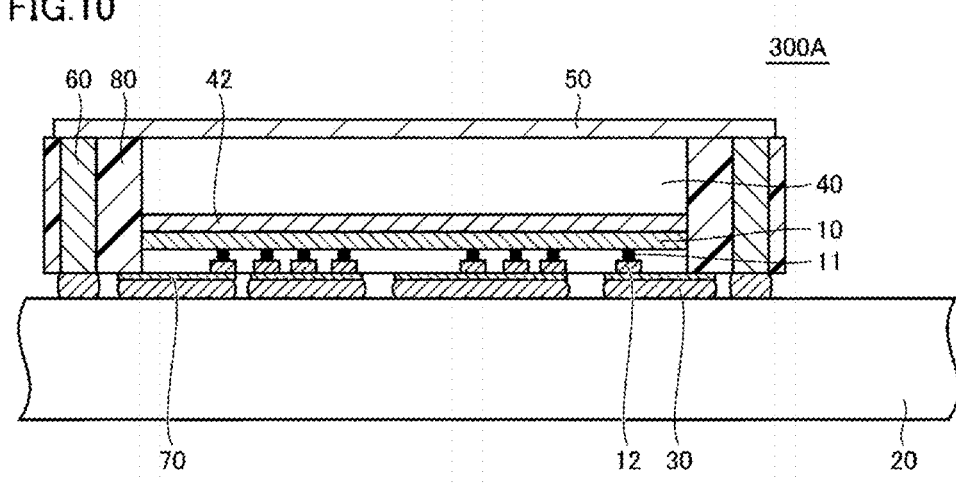
FIG.11
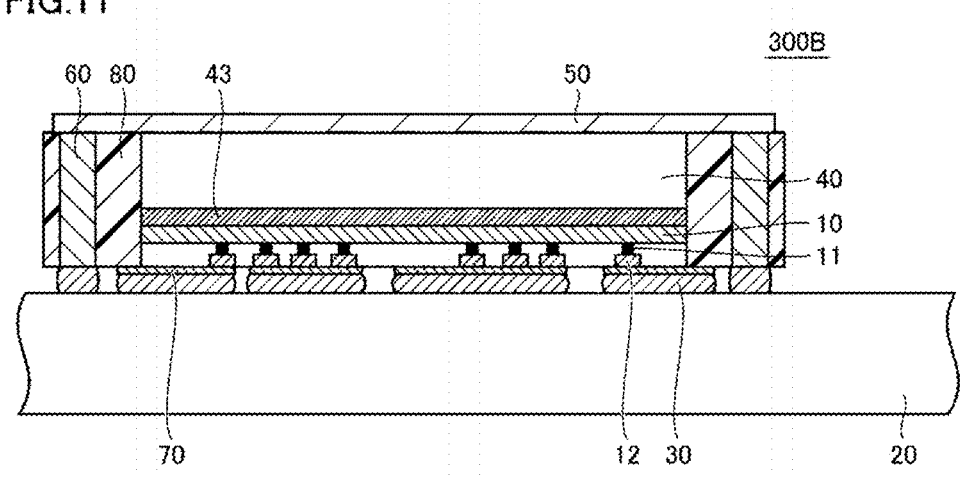

ELECTRONIC DEVICE

CROSS REFERENCE TO RELATED APPLICATIONS

This application claims the benefit of priority to Japanese Patent Application No. 2021-000077 filed on Jan. 4, 2021 and is a Continuation Application of PCT Application No. PCT/JP2021/045550 filed on Dec. 10, 2021. The entire contents of each application are hereby incorporated herein by reference.

BACKGROUND OF THE INVENTION

1. Field of the Invention

The present disclosure relates to an electronic device on which a functional element substrate including a functional element mounted thereon.

2. Description of the Related Art

An electronic device on which a functional element substrate provided with a functional element, such as an integrated circuit, is mounted is provided with a heat dissipation fin and the like so that heat that is generated during driving from the functional element and wiring is dissipated to the outside. Specifically, the electronic device described in Japanese Unexamined Patent Application Publication No. 2004-134480 is a CSP (chip size package) that has a face-down structure in which a semiconductor chip (functional element substrate) provided with an integrated circuit is provided on a base substrate such that a main surface on which the integrated circuit is disposed faces the base substrate. In the electronic device, a heat dissipation fin having an irregular shape is provided at a back surface of the semiconductor chip opposite to the main surface on which the integrated circuit is disposed.

When the material of the semiconductor chip is silicon (Si), it is possible in the electronic device described in Japanese Unexamined Patent Application Publication No. 2004-134480 to transfer heat that is generated from the functional element on the main surface side of the semiconductor chip to the back surface of the semiconductor chip and dissipate the heat at the heat dissipation fin. The material of the semiconductor chip is, however, not limited to silicon and may be a compound semiconductor or the like. The thermal conductivity of compound semiconductors is lower than the thermal conductivity of silicon. Therefore, in the configuration described in Japanese Unexamined Patent Application Publication No. 2004-134480, there is a likelihood that the heat generated from the functional element on the main surface (first main surface) side of the semiconductor chip is not sufficiently transferred to the back surface (second main surface) of the semiconductor chip and deteriorates heat dissipation.

SUMMARY OF THE INVENTION

Preferred embodiments of the present invention provide electronic devices that are each able to improve, in a functional element substrate including a functional element on a first main surface, heat dissipation of the functional element substrate.

An electronic device according to a preferred embodiment of the present invention includes a functional element substrate including a first main surface with a functional element thereon, the functional element substrate being a piezoelectric substrate or a compound semiconductor substrate, a base substrate on which the functional element substrate is mounted such that the first main surface faces the base substrate, a metal connection body electrically connecting the functional element and the base substrate to each other, a support body provided at a second main surface of the functional element substrate opposite to the first main surface, the support body having a higher thermal conductivity than the functional element substrate, a first metal body in contact with the support body, the first metal body including at least a portion extending to outside the functional element substrate in plan view from the support body, and a via connecting the portion of the first metal body outside the functional element substrate and the base substrate to each other, the via having a higher thermal conductivity than the functional element substrate.

According to preferred embodiments of the present invention, the first metal body including at least a portion extending to outside the functional element substrate in plan view from the support body and the base substrate are connected to each other by the via that has a higher thermal conductivity than the functional element substrate, and heat dissipation of the functional element substrate is improved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9 is a sectional view of a substrate from which a temporary substrate has been removed.

FIG. 10 is a sectional view of an electronic device according to Preferred Embodiment 3 of the present invention.

FIG. 11 is a sectional view of a different electronic device according to Preferred Embodiment 3 of the present invention.

DETAILED DESCRIPTION OF THE PREFERRED EMBODIMENTS

Hereinafter, electronic devices according to preferred embodiments will be described with reference to the drawings. In the following description, the same or corresponding components are denoted by the same signs. Therefore, those components will not be described in detail repeatedly.

Preferred Embodiment 1

Figure 1:
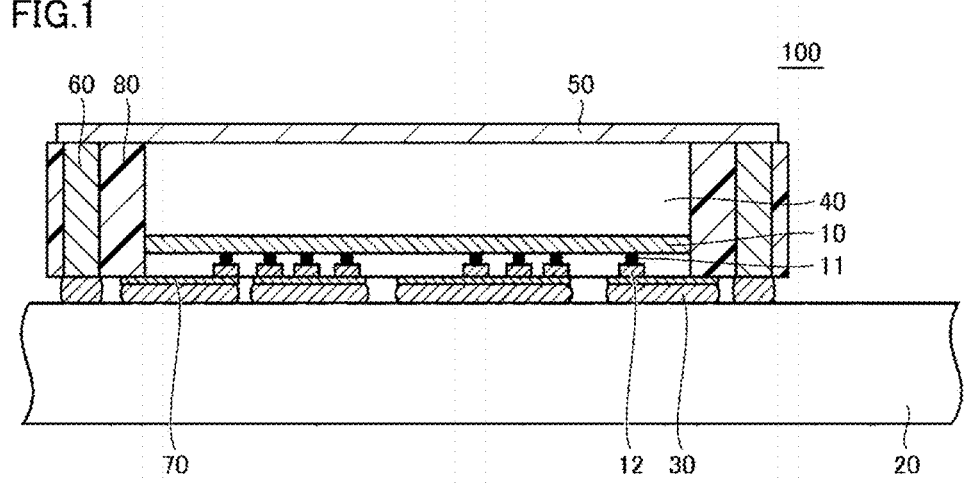
FIG. 1 is a sectional view of an electronic device according to Preferred Embodiment 1 of the present invention.

FIG. 1 is a sectional view of an electronic device 100 according to Preferred Embodiment 1 of the present invention. In the electronic device 100 according to Preferred Embodiment 1, one main surface (first main surface) of a substrate 10 is provided with functional elements 11, and the substrate 10 is mounted on a base substrate 20 such that the main surface provided with the functional elements 11 faces the base substrate 20. The base substrate 20 may be, for example, a package substrate made of a glass epoxy resin, alumina, and the like, a silicon substrate, a piezoelectric substrate (lithium niobate (LN), lithium tantalate (LT)), a component-embedded board (a laminate of polyimide, an epoxy resin, metal wiring, and the like), or the like.

The functional elements 11 are each provided with an electrode 12 (functional element electrode), and the electrode 12 and an electrode on the base substrate 20 are electrically connected to each other by a metal connection body 30 (for example, solder, conductive paste, or the like), thus enabling supply of electric power and a signal to the functional elements 11 from the base substrate 20. Preferably, the metal connection body 30 includes at least a portion that extends to outside the substrate 10 in plan view from a support body 40. In other words, preferably, the metal connection body 30 extends from inside the substrate 10 to outside the substrate 10 in plan view from the support body 40. In the electronic device 100 illustrated in FIG. 1, a metal body 70 (second metal body) is provided between the electrodes 12 and the metal connection body 30, and the electrodes 12 and the metal connection body 30 are electrically connected to each other with the metal body 70 interposed therebetween. The electrodes 12 and the metal connection body 30 may be electrically connected to each other without the metal body 70 provided therebetween. Preferably, the metal body 70 extends to the metal connection body 30 outside the substrate 10 in plan view from the support body 40. In other words, preferably, the metal body 70 extends from inside the metal connection body 30 to outside the metal connection body 30 in plan view from the support body 40.

When the functional elements 11 are operated by supplying electric power and a signal to the functional elements 11 from the base substrate 20, heat is generated in the functional elements 11 and the electrodes 12 during operation. It is possible, if a material such as, for example, silicon (Si) having high thermal conductivity is used in the substrate 10, to transfer the heat generated in the functional elements 11 and the electrodes 12 to the other main surface (second main surface) side of the substrate 10 through the substrate 10 and dissipate the heat. The thermal conductivity of silicon is about 160 W/(m·k) to about 200 W/(m·k).

The substrate 10 is, however, a piezoelectric substrate or a compound semiconductor substrate. The material used in the piezoelectric substrate is, for example, crystal, $LiTaO_3$, $LiNbO_3$, $KNbO_3$, $La_3Ga_5SiO_{14}$, $Li_2B_4O_7$, or the like, and the material used in the compound semiconductor substrate is, for example, GaAs, GaN, or the like. Any of the materials is a material that has lower thermal conductivity than silicon and the like, and there is a likelihood of the materials not being able to sufficiently transfer the heat generated in the functional elements 11 and the electrodes 12 to the other main surface side of the substrate 10 through the substrate 10 and dissipate the heat. For example, the thermal conductivity of $LiTaO_3$ and $LiNbO_3$ is about 3 W/(m·k) to about 5 W/(m·k), the thermal conductivity of GaAs is about 55 W/(m·k), and the thermal conductivity of GaN is about 100 W/(m·k).

Thus, the electronic device 100 according to Preferred Embodiment 1 includes a heat conduction path along which the heat that is generated in the functional elements 11 and the electrodes 12 is transferred to the other main surface side of the substrate 10. Specifically, in the electronic device 100, a support body 40 that has a higher thermal conductivity than the substrate 10 is provided at the other main surface (the main surface of the substrate 10 opposite to the main surface provided with the functional elements 11) of the substrate 10. The material used in the support body 40 is a conductive paste solidified material or the like based on, for example, silicon (Si), silicon carbide (SiC), aluminum oxide (for example, $Al_2O_3$), boron nitride (BN), aluminum nitride (AlN), silicon nitride, copper (Cu), nickel (Ni), or silver (Ag). The thermal conductivity of copper is about 300 W/(m·k) to about 400 W/(m·k), the thermal conductivity of silicon carbide is about 200 W/(m·k), the thermal conductivity of boron nitride is about 150 W/(m·k) to 200 W/(m·k), and the thermal conductivity of aluminum nitride is about 150 W/(m·k) to about 180 W/(m·k).

The thickness of the substrate 10 can be reduced by providing the support body 40. By combining the substrate 10 and the support body 40 to define a substrate having a predetermined thickness, the thickness of the substrate 10 is reduced to thus, while maintaining the characteristics of the substrate 10, reduce a portion having low thermal conductivity and to increase the thickness of the support body 40 to thus increase a portion having high thermal conductivity. Consequently, the heat generated in the functional elements 11 and the electrodes 12 is transferred to the support body 40 and a metal body 50 efficiently, which improves heat dissipation.

In addition, in the electronic device 100, the metal body 50 (first metal body) is provided at a surface of the support body 40 on a side opposite to a side in contact with the substrate 10. At least a portion of the metal body 50 extends to outside the substrate 10 in plan view from the support body 40. In other words, preferably, the metal body 50 extends from inside the substrate 10 to outside the substrate 10 in plan view from the support body 40. The portion of the metal body 50 provided outside is located on both sides of opposing sides of the substrate 10 in plan view from the support body 40.

The portion of the metal body 50 outside the substrate 10 and the base substrate 20 are connected to each other by a via 60. In the metal body 50, for example, copper, aluminum (Al), or the like is used. In the via 60, for example, at least one of a copper-based conductive paste solidified material and a silver-based conductive paste solidified material that has a higher thermal conductivity than the substrate 10 is used. While the via 60 illustrated in FIG. 1 is connected to the base substrate 20 with the metal connection body 30 interposed therebetween, the via 60 may be connected directly to the base substrate 20 without the metal connection body 30 interposed therebetween or connected to the base substrate 20 with the metal connection body 30 and the metal body 70 interposed therebetween.

As a result of the metal body 50 and the base substrate 20 being connected to each other by the via 60, a new heat conduction path along which the heat generated in the functional elements 11 and the electrodes 12 is transferred from the metal body 50 through the via 60 to the base substrate 20 can be ensured. Specifically, the new heat conduction path is a heat conduction path along which the heat generated in the functional elements 11 and the electrodes 12 is transferred to the substrate 10, the support body 40, the metal body 50, the via 60, the metal connection body 30, and the base substrate 20 in this order to be dissipated from the other main surface of the substrate 10. Consequently, the electronic device 100 can improve heat dissipation not only from the one main surface (first main surface) of the substrate 10 but also from the other main surface (second main surface) of the substrate 10.

It is preferable in the electronic device 100 that a cross-sectional area that is obtained by cutting the portion of the via 60 connected to the metal connection body 30 in a lateral direction orthogonal or substantially orthogonal to the laminate direction of the metal connection body 30 and the via 60 be larger than at least one of cross-sectional areas obtained by cutting each of a plurality of the metal connection bodies 30 in the lateral direction. By increasing the cross-sectional area of the via 60, it is possible to ensure a large heat conduction path along which heat is transferred from the metal connection body 30 to the via 60 and reaches the metal body 50 and possible to further improve the heat dissipation from the other main surface side of the substrate 10.

As illustrated in FIG. 1, the electronic device 100 has a configuration in which a chip having a structure in which the substrate 10 provided with the functional elements 11 and the electrodes 12 and the support body 40 are laminated is face-down mounted on the base substrate 20. While the functional elements 11 and the electrodes 12 are illustrated with the substrate 10, a protective film, routing wiring, an electrically insulating layer, and the like may be provided in addition to these components. Further, in the electronic device 100, the metal body 50 is provided on the back side (the surface opposite to the surface provided with the functional elements 11) of the substrate 10 that is face-down mounted on the base substrate 20, and the via 60 that connects the metal body 50 and the base substrate 20 to each other is disposed. Preferably, the metal body 50 is provided on the support body 40 so as to include a region of the substrate 10 where the functional elements 11 and the electrodes 12 are provided in plan view from the support body 40. Consequently, the heat that is transferred to the back surface (the other main surface) of the substrate 10 provided with the functional elements 11 can be dissipated by the metal body 50.

The electronic device 100 illustrated in FIG. 1 is provided with an insulator 80 that covers a side surface of the substrate 10 and a side surface of the support body 40. The side surface of the substrate 10 is a surface that connects the one main surface of the substrate 10 provided with the functional elements 11 and the other main surface of the substrate 10 opposite to the surface provided with the functional elements 11 to each other. The side surface of the support body 40 is a surface that connects the surface of the support body 40 close to the substrate 10 and the surface of the support body 40 opposite to the surface close to the substrate 10 to each other. The via 60 is provided in the insulator 80 at the side surface of the substrate 10 and the side surface of the support body 40 and can ensure electrical insulation from the substrate 10 and the support body 40.

Figure 2:
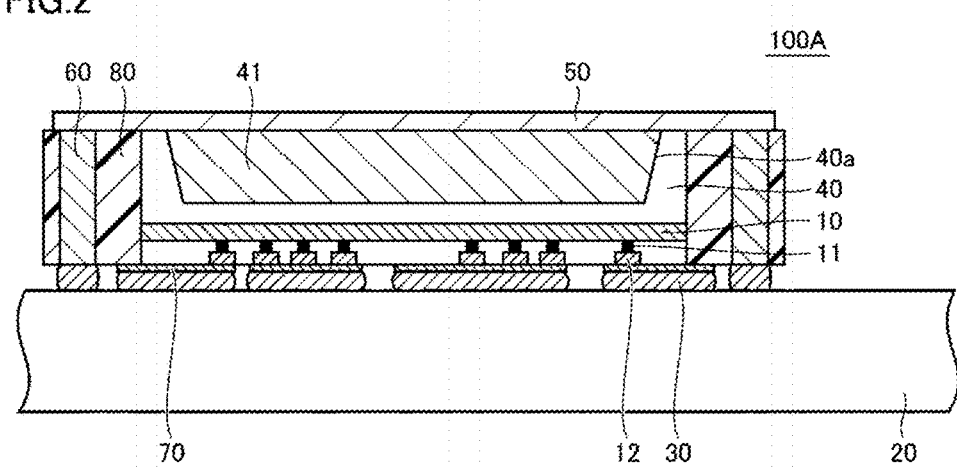
FIG. 2 is a sectional view of a different electronic device according to Preferred Embodiment 1 of the present invention.

Regarding the electronic device 100 illustrated in FIG. 1, a configuration in which the support body 40 is made of a single material has been described. The configuration is, however, not limited thereto. For example, a configuration in which a material that differs from the material of the support body 40 is provided in a recess formed by recessing the support body 40 may be used. FIG. 2 is a sectional view of a different electronic device 100A according to Preferred Embodiment 1. The same or corresponding components of the electronic device 100A illustrated in FIG. 2 as the components of the electronic device 100 illustrated in FIG. 1 are denoted by the same signs and will not be described in detail repeatedly.

In the electronic device 100A, a conductive film 41 having a higher thermal conductivity than the support body 40 is provided in a recess 40a that is formed by recessing the surface of the support body 40 opposite to the surface thereof in contact with the substrate 10. On the support body 40, the recess 40a is recessed toward the functional elements 11. In other words, the recess 40a is an opening portion that is open at the support body 40 to the metal body 50 side. The conductive film 41 is made of a multilayer structure that includes at least one of, for example, copper (Cu), gold (Au), tungsten (W), and nickel (Ni) or an alloy that contains at least one of copper (Cu), gold (Au), tungsten (W), and nickel (Ni). The conductive film 41 is in contact with the metal body 50. Therefore, due to the conductive film 41 provided in the recess 40a of the support body 40, the electronic device 100A can further improve the heat dissipation from the other main surface side of the substrate 10. In plan view from the one main surface, the recess 40a is at least provided at a position on the substrate 10 where the recess 40a overlaps a region in which the functional elements 11 or the electrodes 12 are provided. Alternatively, the support body 40 may be provided with, instead of the recess 40a, a through hole that extends through the support body 40 and to the other main surface of the substrate 10.

Figure 3:
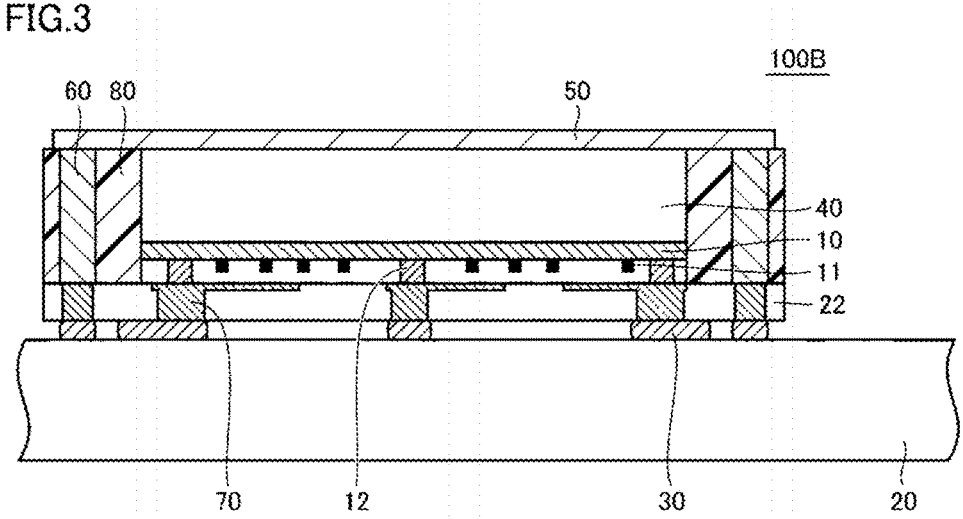
FIG. 3 is a sectional view of another different electronic device according to Preferred Embodiment 1 of the present invention.

Further, one example in which the functional elements 11 provided at the substrate 10 are surface acoustic wave elements will be described. FIG. 3 is a sectional view of another different electronic device 100B according to Preferred Embodiment 1. The same or corresponding components of the electronic device 100B illustrated in FIG. 3 as the components of the electronic device 100 illustrated in FIG. 1 are denoted by same signs and will not be described in detail repeatedly. However, when the functional elements 11 are surface acoustic wave elements, a piezoelectric substrate is to be used as the material of the substrate 10.

It is required when the functional elements 11 are surface acoustic wave elements to ensure operation of a plurality of comb electrodes (IDT electrodes) and the like by providing a hollow portion at the side provided with the functional elements 11. Therefore, as illustrated in FIG. 3, an intermediate substrate 22 is provided between the substrate 10 and the base substrate 20 to ensure a hollow portion between the intermediate substrate 22 and the substrate 10 in the electronic device 100B. The electrodes 12 provided at the substrate 10 are connected to the metal body 70 provided at the intermediate substrate 22, and the metal body 70 is connected to the metal connection body 30. Preferably, the metal body 70 has a large cross-sectional area to cause the heat to be transferred from the electrodes 12 at the substrate 10 to the metal connection body 30 at the base substrate 20 easily.

As described above, the electronic devices 100, 100A, and 100B according to Preferred Embodiment 1 each include the substrate 10, the base substrate 20, the metal connection body 30, the support body 40, the metal body 50, and the via 60. The substrate 10 includes the one main surface provided with the functional elements 11 and is a piezoelectric substrate or a compound semiconductor substrate. The substrate 10 is mounted on the base substrate 20 such that the one main surface of the substrate 10 faces the base substrate 20. The metal connection body 30 electrically connects the electrodes 12 of the functional elements 11 and wiring of the base substrate 20 to each other. The support body 40 is provided at the other main surface of the substrate 10 opposite to the one main surface and has a higher thermal conductivity than the substrate 10. The metal body 50 is in contact with the support body 40 and includes at least a portion that extends to outside the substrate 10 in plan view from the support body 40. The via 60 connects the portion of the metal body 50 outside the substrate 10 and the base substrate 20 to each other and has a higher thermal conductivity than the substrate 10.

Consequently, each of the electronic devices 100, 100A, and 100B according to Preferred Embodiment 1 can improve heat dissipation of the substrate 10 since the metal body 50 including at least a portion that extends to outside the substrate 10 in plan view from the support body 40 and the base substrate 20 are connected to each other by the via that has a higher thermal conductivity than the substrate 10.

Preferably, the metal body 50 is extends across the substrate 10 in plan view from the support body 40 such that the portion of the metal body 50 outside the substrate 10 is located on both sides of opposing sides of the substrate 10 in plan view from the support body 40, and the portion of the metal body 50 on both sides is connected to the base substrate 20 with the via 60 interposed therebetween. Consequently, each of the electronic devices 100, 100A, and 100B can ensure a large path of heat conduction from the base substrate 20 side to the other main surface side of the substrate 10.

Preferably, the metal connection body 30 extends from inside of the substrate 10 in plan view from the support body 40 to outside the substrate 10. Consequently, each of the electronic devices 100, 100A, and 100B can ensure a large path of heat conduction from the base substrate 20 side to the other main surface side of the substrate 10.

Preferably, the metal body 70 is further provided between the electrodes 12 of the functional elements 11 and the metal connection body 30. Consequently, connection between the electrodes 12 of the functional elements 11 and the metal connection body 30 is eased. Preferably, the metal body 70 extends from inside the substrate 10 in plan view from the support body 40 to outside the substrate 10.

Preferably, the support body 40 has the recess 40a or a through hole in a surface that is opposite to a surface close to the substrate 10, the conductive film 41 having a higher thermal conductivity than the support body 40 is formed in the recess or the through hole, and the conductive film 41 is in contact with the metal body 50. Consequently, the electronic device 100A can further improve the heat dissipation from the other main surface side of the substrate 10.

Preferably, the support body 40 includes, for example, at least one of a mixture of a metal and a resin, silicon, silicon carbide, aluminum oxide, boron nitride, aluminum nitride, silicon nitride, copper, and nickel.

Preferably, the insulator 80 that covers a side surface of the substrate 10 and a side surface of the support body 40 is further included. Consequently, each of the electronic devices 100, 100A, and 100B can ensure electrical insulation from the side surfaces of the substrate 10 and the support body 40.

Preferably, a plurality of the metal connection bodies 30 are provided, and the cross-sectional area of the via 60 is larger than at least one of cross-sectional areas of the plurality of metal connection bodies 30. Consequently, each of the electronic devices 100, 100A, and 100B can ensure a large path of heat conduction from the base substrate 20 side to the other main surface side of the substrate 10.

Preferred Embodiment 2

Regarding the electronic devices 100, 100A, and 100B according to Preferred Embodiment 1, a configuration in which the metal body 50 is provided at the support body 40 has been described. Regarding an electronic device according to Preferred Embodiment 2 of the present invention, a configuration in which an electronic component is mounted on a surface of a metal body on a side opposite to a side in contact with a support body will be described.

Figure 4:
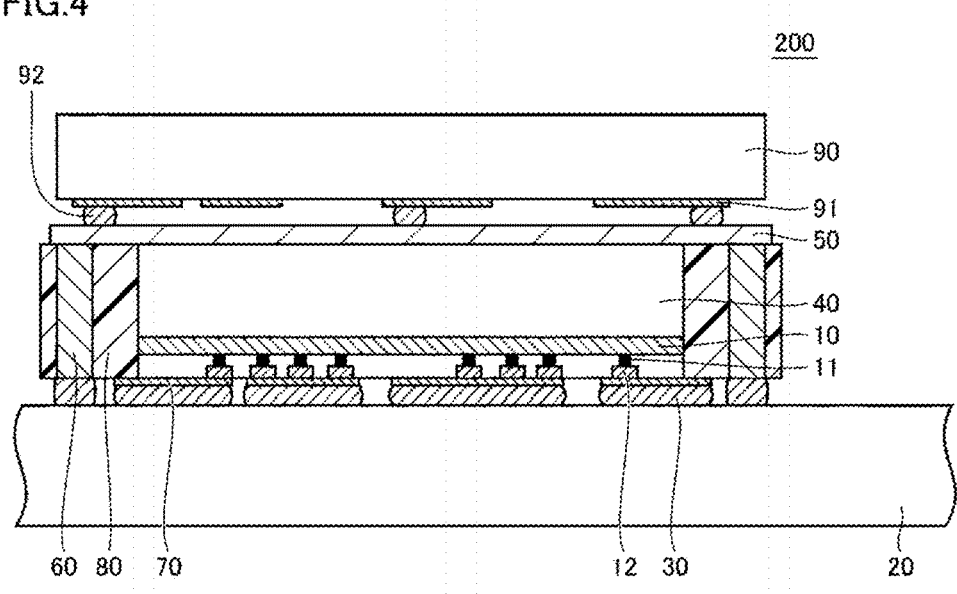
FIG. 4 is a sectional view of an electronic device according to Preferred Embodiment 2 of the present invention.

FIG. 4 is a sectional view of an electronic device 200 according to Preferred Embodiment 2. Components from the base substrate 20 to the metal body 50 in the electronic device 200 according to Preferred Embodiment 2 are the same or substantially the same as the components in the electronic device 100 according to Preferred Embodiment 1. The same or corresponding components are denoted by the same signs and will not be described in detail repeatedly. The components from the base substrate 20 to the metal body 50 in the electronic devices 100A and 100B may be applied to those in the electronic device 200.

In the electronic device 200 illustrated in FIG. 4, an electronic component 90 is surface mounted on a surface of the metal body 50 on a side opposite to a side that is in contact with the support body 40. Specifically, the electronic component 90 is, for example, flip-chip mounted, and electrodes 91 and an electrode that is provided at a surface of the metal body 50 are connected to each other by bumps 92.

Next, a non-limiting example of a method of manufacturing the electronic device 200 will be described. The manufacture method up to mounting of the electronic component 90 on a surface of the metal body 50 is the same or substantially the same as a method of manufacturing the electronic device 100 illustrated in FIG. 1. Thus, the method of manufacturing the electronic device 100 will be also described together.

Figure 5:
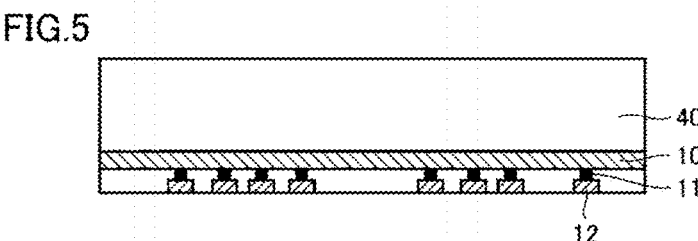
FIG. 5 is a sectional view of a substrate provided with functional elements.

First, a method of manufacturing the substrate 10 provided with the functional elements 11 will be described. FIG. 5 is a sectional view of the substrate 10 provided with the functional elements 11. FIG. 5 illustrates the substrate 10 that is obtained by, after forming the functional elements 11, the electrodes 12, wiring, an electrically insulating layer, and the like on the substrate 10, dividing the substrate 10 into individual pieces in a unit with which a desired function can be achieved. In the substrate 10 illustrated in FIG. 5, the thickness of the other main surface of the substrate 10 opposite to the one main surface provided with the functional elements 11 is reduced, and the support body 40 is disposed at the surface whose thickness has been reduced.

Next, the via 60 is formed at a predetermined position on a temporary substrate. The via 60 is formed on the temporary substrate by, for example, a semi-additive method or the like. By forming the via 60 by the semi-additive method, it is possible to form the via 60 that is perpendicular or substantially perpendicular and rectangular or substantially rectangular and that has a high aspect ratio. It is thus possible to minimize the positional displacement of the via 60 in plan view from the support body 40. In order to improve heat dissipation from the other main surface side of the substrate 10, it is preferable to increase the cross-sectional area of the via 60 within a range in which the via 60 does not adversely affect the electrical characteristics of the functional elements 11.

Figure 6:
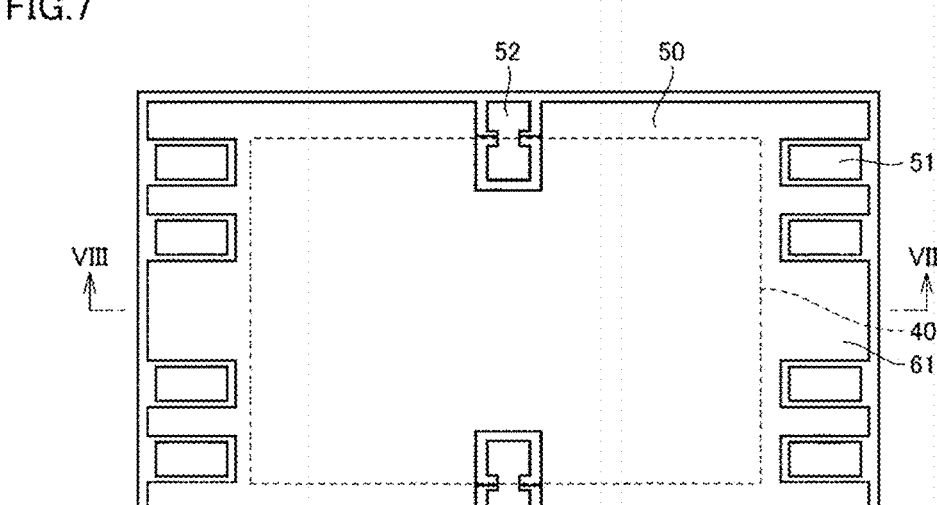
FIG. 6 is a sectional view of a substrate that includes a via.

On the temporary substrate on which the via 60 is formed at a predetermined position, the substrate 10 is positioned such that the one main surface faces the temporary substrate. The substrate 10 and the via 60 on the temporary substrate are covered by an insulator, and the thicknesses of the support body 40, the via 60, and the insulator are each reduced to a desired thickness. FIG. 6 is a sectional view of the substrate 10 in which the via 60 has been formed. By performing the above-described manufacturing method, as illustrated in FIG. 6, the substrate 10, the via 60, and the insulator 80 are formed on a temporary substrate 25.

Figure 7:
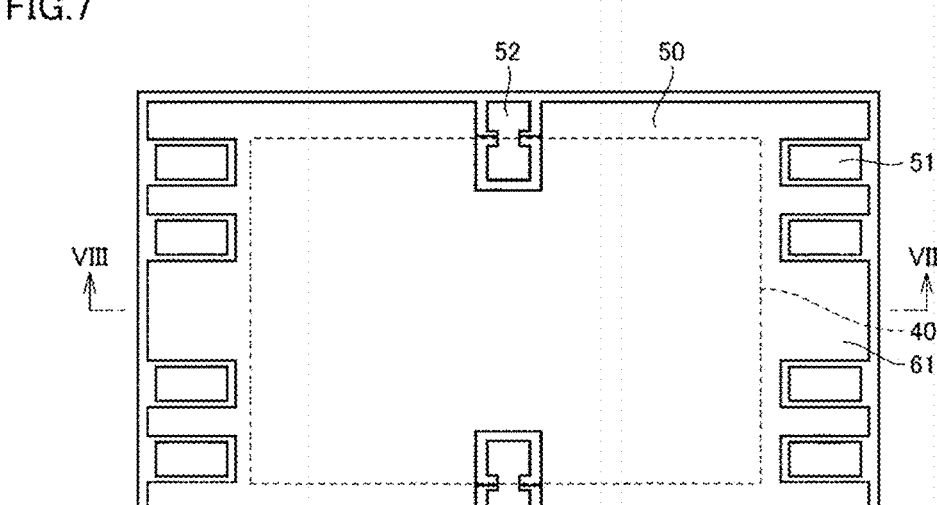
FIG. 7 is a plan view in which a metal body is provided at a surface of a support body.
Figure 8:
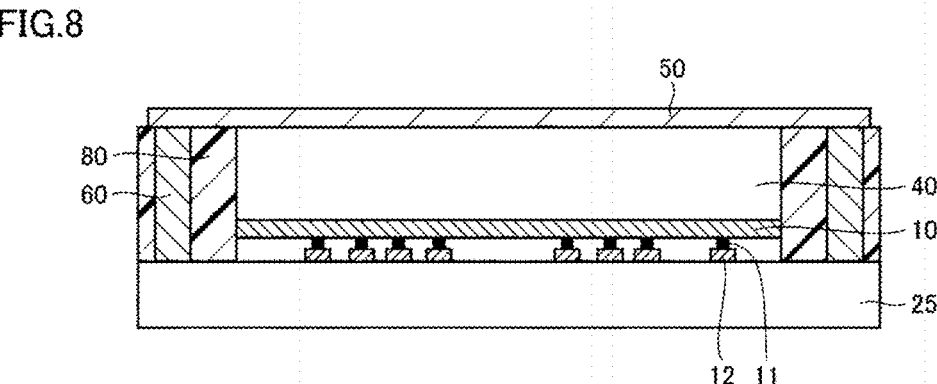
FIG. 8 is a sectional view in which a metal body is provided at a surface of a support body.

Next, the metal body 50 is formed at a surface of the support body 40 on a side opposite to the side in contact with the substrate 10. FIG. 7 is a plan view in which the metal body 50 is formed at a surface of the support body 40. FIG. 8 is a sectional view in which the metal body 50 is formed at a surface of the support body 40. The sectional view illustrated in FIG. 8 is a sectional view along the VIII-VIII plane illustrated in FIG. 7. It is preferable that a material having a higher thermal conductivity than the substrate 10, the support body 40, and the insulator 80 is selected for the metal body 50. Consequently, the heat generated in the functional elements 11 and the electrodes 12 can escape to the base substrate 20 from the other main surface side of the substrate 10 through the metal body 50 and the via 60.

In addition, the metal body 50 is formed by a semi-additive method, and, as illustrated in FIG. 7, terminal pads 51 and 52 to connect to the electronic component 90 to be mounted, a pad 61 that is to be connected to the via 60, and the like are patterned on the metal body 50. The material of the metal body 50 is preferably a metal film including, for example, mainly copper. The metal body 50 is provided across the substrate 10 in plan view from the support body 40, and a portion of the metal body 50 outside the substrate 10 is located on both sides of opposing sides of the substrate 10 in plan view from the support body 40. Consequently, the heat generated in the functional elements 11 and the electrodes 12 is caused to use a heat conduction path such as the via 60 outside the substrate 10 and can improve heat dissipation.

Next, for solder connection, an under-bump metal layer is formed at the terminal pads 51 and 52 on the metal body 50, and the electronic component 90 is mounted on the upper side of the metal body 50 in FIG. 8. The electronic component 90 is connected by the bumps 92 to the terminal pads 51 and 52 on the metal body 50, thus forming a multilayer structure in which the electronic component 90 is mounted on the substrate 10. The cross-sectional area of the via 60 is preferably larger than the cross-sectional area of each of the bumps 92 of the electronic component 90. Further, the temporary substrate 25 is removed from the substrate 10 on which the electronic component 90 is mounted. FIG. 9 is a sectional view of the substrate 10 from which the temporary substrate 25 has been removed. When the electronic device 100 in FIG. 1 is to be manufactured, a next manufactured method is performed without mounting the electronic component 90 on the upper side of the metal body 50.

Next, the metal body 70 is formed at a surface of the substrate 10 from which the temporary substrate 25 has been removed. It is preferable that a material having a higher thermal conductivity than the insulator 80, the support body 40, the substrate 10, and the metal connection body 30 is used in the metal body 70. Patterning of the metal body 70 is formed to extend from the substrate 10 to the region of the insulator 80. In other words, the metal body 70 extends to the metal connection body 30 outside the substrate 10 in plan view from the support body 40. Consequently, the path of heat conduction to the base substrate 20 can be widened.

Next, an under-bump metal layer is formed at, of the metal body 70, a portion that is to be connected to the metal connection body 30. On the formed under-bump metal layer, the metal connection body 30, which is a terminal to connect to the base substrate 20, is formed. At this time, patterning of the metal connection body 30 is formed to extend from the substrate 10 to the region of the insulator 80. In other words, a portion of the metal connection body 30 extends to outside the substrate 10. Consequently, the path of heat conduction to the base substrate 20 can be widened. In particular, the metal connection body 30 is made of, for example, solder or a conductive paste and tends to have low thermal conductivity and hinder the heat conduction. Thus, by increasing the size of the portion of the metal connection body 30 connected to the metal body 70, the heat dissipation can be improved.

Next, the substrate 10 at which the metal connection body 30 is formed is connected to a wiring layer on the base substrate 20, and the substrate 10 is mounted on the base substrate 20. A sectional view in which the substrate 10 is mounted on the base substrate 20 is illustrated in FIG. 4. As illustrated in FIG. 4, the metal connection body 30 is disposed to extend from the region of the substrate 10 to outside the region. After being connected to the base substrate 20, the metal connection body 30 is also similarly disposed to extend from the region of the substrate 10 to outside the region. It may be configured such that the substrate 10 and another electronic component are mounted on the base substrate 20 and sealed by a common sealing material (insulator), and the metal body 50 is disposed over the sealing material.

As described above, the electronic device 200 according to Preferred Embodiment 2 further includes the electronic component 90 that is mounted on a surface of the metal body 50 opposite to the surface thereof close to the support body 40. Consequently, the electronic device 200 can be devices that have various configurations while improving the heat dissipation from the other main surface side of the substrate 10. The cross-sectional area of the via 60 is preferably larger than the cross-sectional area of a portion (for example, a portion (bump 92) at which the electronic component 90 is electrically connected) of the electronic component 90 at which the electronic component 90 is mounted on a surface of the metal body. Consequently, the path of heat conduction to the base substrate 20 can be widened.

Preferred Embodiment 3

Regarding the electronic devices 100, 100A, and 100B according to Preferred Embodiment 1, a configuration in which the support body 40 is provided at the substrate 10 has been described. Regarding an electronic device according to Preferred Embodiment 3 of the present invention, an example in which a component other than the support body 40 is provided at the other main surface of the substrate 10 will be described. The configuration, in which the electronic component 90 is mounted on a surface of the metal body 50, described in Preferred Embodiment 2 may be applied to the electronic device according to Preferred Embodiment 3.

FIG. 10 is a sectional view of an electronic device 300A according to Preferred Embodiment 3. The same or corresponding components of the electronic device 300A illustrated in FIG. 10 as the components of the electronic device 100 illustrated in FIG. 1 are denoted by the same signs and will not be described in detail repeatedly.

In the electronic device 300A, an insertion layer 42 is provided between the substrate 10 and the support body 40. The insertion layer 42 has a higher thermal conductivity than the substrate 10 and the support body 40. Therefore, heat dissipation from the other main surface side of the substrate 10 can be further improved. The insertion layer 42 may be provided, instead of at the entire surface between the substrate 10 and the support body 40, only at a portion that includes a region of the substrate 10 where the functional elements 11 and the electrodes 12 are provided in plan view from the support body 40. As a material of the highly thermally conductive insertion layer 42, a metal material including, for example, mainly copper or the like is preferably selected.

FIG. 11 is a sectional view of a different electronic device 300B according to Preferred Embodiment 3. The same or corresponding components of the electronic device 300B illustrated in FIG. 11 as the components of the electronic device 100 illustrated in FIG. 1 are denoted by the same signs and will not be described in detail repeatedly.

In the electronic device 300B, an intermediate layer 43 is provided between the substrate 10 and the support body 40 so as to be in contact with the substrate 10. The intermediate layer 43 has a coefficient of linear expansion that is between the coefficient of linear expansion of the substrate 10 and the coefficient of linear expansion of the support body 40. Therefore, a compressive stress can be applied by the intermediate layer 43 to the substrate 10 at the time of a temperature increase. In particular, when the substrate 10 is a crystalline substrate, the compressive stress of the intermediate layer 43 can reduce or prevent generation of cracking of the substrate 10 due to a tensile stress being applied to the substrate 10 at the time of a temperature increase. As the intermediate layer 43, for example, a material that includes copper (Cu), gold (Au), platinum (Pt), titanium (Ti), tantalum (Ta), tungsten (W), or the like can be used. In addition, an intermediate layer that is made of a material having a coefficient of linear expansion smaller than the coefficients of linear expansion of the support body 40 and the substrate 10 may be provided on the support body 40.

Figure 12:
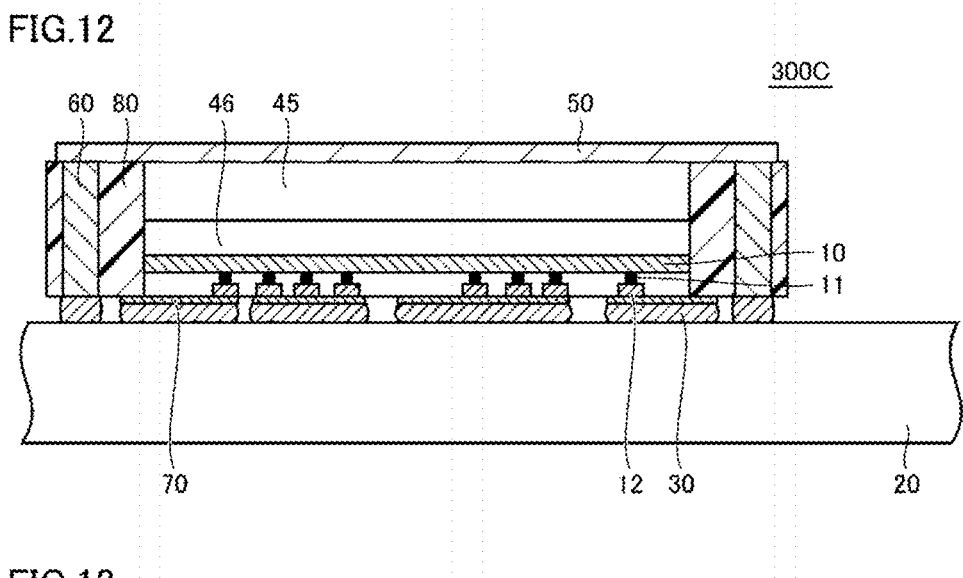
FIG. 12 is a sectional view of another different electronic device according to Preferred Embodiment 3 of the present invention.

FIG. 12 is a sectional view of another different electronic device 300C according to Preferred Embodiment 3. The same or corresponding components of the electronic device 300C illustrated in FIG. 12 as the components of the electronic device 100 illustrated in FIG. 1 are denoted by the same signs and will not be described in detail repeatedly.

The electronic device 300C is one example applied to a surface acoustic wave device, the substrate 10 is a piezoelectric substrate, and the support body defines and functions as a high-acoustic-velocity support substrate 45 through which bulk waves propagate at a higher acoustic velocity than acoustic waves, such as surface acoustic waves and boundary waves, propagating through the piezoelectric substrate. In addition, the electronic device 300C is further provided with a low-acoustic-velocity film 46 between the substrate 10 and the high-acoustic-velocity support substrate 45 and through which bulk waves propagate at a lower acoustic velocity than acoustic waves propagating through the piezoelectric substrate. In other words, the electronic device 300C has a multilayer structure in which the substrate 10, the low-acoustic-velocity film 46, and the high-acoustic-velocity support substrate 45 are laminated in this order.

The substrate 10 is made of, for example, a 50° Y-cut X-propagation LiTaO₃ piezoelectric single crystal or piezo-electric ceramics (a lithium tantalate single crystal or ceramics cut along a plane that has, as a normal line, an axis rotated by about 50° from the Y-axis with the X-axis as the center axis and through which acoustic waves propagate in the X-axis direction). For example, when a wavelength determined by an electrode finger pitch of IDT electrodes, which are the functional elements 11, is λ, the thickness of the substrate 10 is less than or equal to about 3.5λ.

The high-acoustic-velocity support substrate 45 is a substrate that supports the low-acoustic-velocity film 46 and the substrate 10 provided with the functional elements 11. The high-acoustic-velocity support substrate 45 is also a substrate in which the acoustic velocity of bulk waves in the high-acoustic-velocity support substrate 45 is higher than the acoustic velocity of acoustic waves, such as surface acoustic waves and boundary waves, propagating through the substrate 10, and the high-acoustic-velocity support substrate 45 defines and functions to confine acoustic waves in a portion where the substrate 10 and the low-acoustic-velocity film 46 are laminated so as not to leak upward in FIG. 14 from the high-acoustic-velocity support substrate 45. The thickness of the high-acoustic-velocity support substrate 45 is, for example, about 120 μm.

The low-acoustic-velocity film 46 is a film in which the acoustic velocity of bulk waves in the low-acoustic-velocity film 46 is lower than the acoustic velocity of acoustic waves propagating through the substrate 10 and is disposed between the substrate 10 and the high-acoustic-velocity support substrate 45. This structure and a property of acoustic waves that energy thereof basically concentrates in a medium in which acoustic velocity is low suppress leaking of acoustic wave energy to the outside of the IDT electrodes as the functional elements 11. The thickness of the low-acoustic-velocity film 46 is, for example, about 670 nm. With this multilayer structure, the Q-value at a resonant frequency and an anti-resonant frequency can be significantly increased compared with a structure in which the piezoelectric substrate is used as a single layer. In other words, since a surface acoustic wave resonator having a high Q-value can be configured, it is possible to configure a filter in which an insertion loss is small by using the acoustic wave resonator.

As a material of the high-acoustic-velocity support substrate 45, a piezoelectric, such as, for example, aluminum nitride, aluminum oxide, silicon carbide, silicon nitride, silicon, sapphire, lithium tantalate, lithium niobate, or crystal, ceramics such as alumina, zirconia, cordierite, mullite, steatite, or forsterite, magnesia diamond, a material containing one of the aforementioned materials as a main component, or a material containing a mixture of the aforementioned materials can be used.

The low-acoustic-velocity film 46 is made of, for example, a material including, as a main component, glass, silicon oxynitride, tantalum oxide, or a compound in which fluorine, carbon, or boron is added to silicon oxide. The material of the low-acoustic-velocity film 46 is at least a material having a relatively low acoustic velocity.

The high-acoustic-velocity support substrate 45 may have a structure in which a support body and a high-acoustic film through which bulk waves propagate at a higher acoustic velocity than acoustic waves, such as surface acoustic wave and boundary waves, propagating through the substrate 10 are laminated. In this case, in the support body, a piezoelectric such as, for example, sapphire, lithium tantalate, lithium niobate, or crystal, various types of ceramics such as alumina, magnesia, silicon nitride, aluminum nitride, silicon carbide, zirconia, cordierite, mullite, steatite, or forsterite, a dielectric such as glass, a semiconductor such as silicon or gallium nitride, a resin substrate, or the like can be used. In the high-acoustic film, a variety of high-acoustic-velocity materials including, for example, aluminum nitride, aluminum oxide, silicon carbide, silicon nitride, silicon oxynitride, a DLC film, diamond, a medium including one of the aforementioned materials as a main component, and a medium containing a mixture of the aforementioned materials as a main component can be used.

As described above, the electronic device 300A according to Preferred Embodiment 3 further includes, between the support body 40 and the substrate 10, the insertion layer 42 that has a higher thermal conductivity than the substrate 10 and the support body 40. Consequently, it is possible to further improve the heat dissipation from the other main surface side of the substrate 10.

In addition, the electronic device 300B according to Preferred Embodiment 3 further includes, between the substrate 10 and the support body 40, the intermediate layer 43 that is in contact with the substrate 10 and that has a coefficient of linear expansion that is between the coefficient of linear expansion of the substrate 10 and the coefficient of linear expansion of the support body 40. Consequently, a compressive stress can be applied by the intermediate layer 43 to the substrate 10 at the time of a temperature increase.

Further, in the electronic device 300C according to Preferred Embodiment 3, the substrate is a piezoelectric substrate, the support body 40 is the high-acoustic-velocity support substrate 45 through which bulk waves propagate at a higher acoustic velocity than acoustic waves, such as surface acoustic waves and boundary waves, propagating through the piezoelectric substrate, and the electronic device 300C further includes the low-acoustic-velocity film 46 provided between the substrate 10 and the high-acoustic-velocity support substrate 45 and through which bulk wave propagate at a lower acoustic velocity than acoustic waves propagating through the substrate 10. Consequently, it is possible to confine acoustic waves in a portion where the substrate 10 and the low-acoustic-velocity film 46 are laminated so as not to leak upward from the high-acoustic-velocity support substrate 45.

The configurations of the electronic devices 300A to 300C described in Preferred Embodiment 3 may be combined together, as appropriate.

Other Modification

Figure 13:
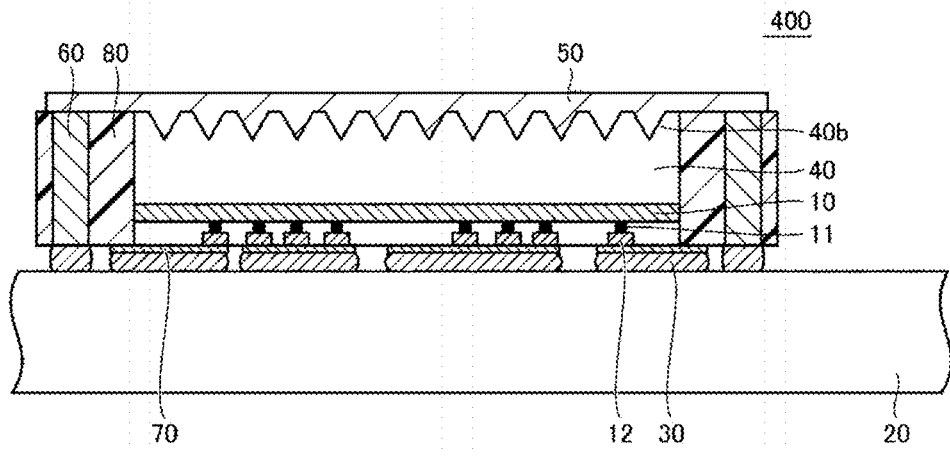
FIG. 13 is a sectional view of an electronic device according to a modification of a preferred embodiment of the present invention.

FIG. 13 is a sectional view of an electronic device 400 according to a modification of a preferred embodiment of the present invention. Note that the same or corresponding components of the electronic device 400 illustrated in FIG. 13 as the components of the electronic device 100 illustrated in FIG. 1 are denoted by the same signs and will not be described in detail repeatedly. The modification can be applied, as appropriate, to the configurations of the electronic devices described above.

In the electronic device 400, the support body 40 has surface roughness that is larger on a surface close to the metal body 50 than on a surface close to the substrate 10. In other words, surface roughness 40b of the surface of the support body 40 close to the metal body 50 is larger than the surface roughness of the surface thereof close to the substrate 10. Consequently, a contact area between the support body 40 and the metal body 50 is increased. It is thus possible to improve heat dissipation to the metal body 50.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device comprising:
a functional element substrate including a first main surface with a functional element provided thereon, the functional element substrate being a piezoelectric substrate or a compound semiconductor substrate;
a base substrate on which the functional element substrate is mounted such that the first main surface faces the base substrate;
a metal connection body electrically connecting the functional element and the base substrate to each other;
a support body at a second main surface of the functional element substrate opposite to the first main surface, the support body having a higher thermal conductivity than the functional element substrate;
a first metal body in contact with the support body, the first metal body including at least a portion that extends to outside the functional element substrate in plan view from the support body;
a via connecting the portion of the first metal body outside the functional element substrate and the base substrate to each other, the via having a higher thermal conductivity than the functional element substrate; and
a second metal body between the functional element and the metal connection body; wherein
the first metal body extends across the functional element substrate in plan view from the support body;
the portion of the first metal body outside the functional element substrate is located on both sides of opposing sides of the functional element substrate in plan view from the support body;
the portion of the first metal body on the both sides is connected to the base substrate with the via interposed between the portion and the base substrate;
the metal connection body extends from inside the functional element substrate in plan view from the support body to outside the functional element substrate; and
the second metal body extends from inside the functional element substrate in plan view from the support body to outside the functional element substrate.

2. The electronic device according to claim 1, wherein
the support body includes a recess or a through hole in a surface opposite to a surface adjacent to the functional element substrate;
a conductive film that has a higher thermal conductivity than the support body is provided in the recess or the through hole; and
the conductive film is in contact with the first metal body.

3. The electronic device according to claim 1, wherein
the functional element substrate is a piezoelectric substrate;
the support body is a high-acoustic-velocity support substrate through which bulk waves propagate at a higher acoustic velocity than acoustic waves that propagate through the functional element substrate; and
the electronic device further includes a low-acoustic-velocity film between the functional element substrate and the high-acoustic-velocity support substrate, and through which bulk waves propagate at a lower acoustic velocity than acoustic waves that propagate through the functional element substrate.

4. The electronic device according to claim 1, further comprising:
an insertion layer between the support body and the functional element substrate; wherein
the insertion layer has a higher thermal conductivity than the functional element substrate and the support body.

5. The electronic device according to claim 1, further comprising:

an intermediate layer between the functional element substrate and the support body; wherein the intermediate layer is in contact with the functional element substrate and has a coefficient of linear expansion that is between a coefficient of linear expansion of the functional element substrate and a coefficient of linear expansion of the support body.

6. The electronic device according to claim 1, wherein the support body includes at least one of a mixture of a metal and a resin, silicon, silicon carbide, aluminum oxide, boron nitride, aluminum nitride, silicon nitride, copper, or nickel.

7. The electronic device according to claim 1, wherein the support body has a surface roughness that is larger on a surface closer to the first metal body than on a surface closer to the functional element substrate.

8. The electronic device according to claim 1, further comprising an insulator covering a side surface of the functional element substrate and a side surface of the support body.

9. The electronic device according to claim 1, wherein a plurality of the metal connection bodies are provided; and the via has a cross-sectional area larger than at least one of cross-sectional areas of the plurality of metal connection bodies.

10. The electronic device according to claim 1, further comprising an electronic component mounted on a surface of the first metal body opposite to a surface of the first metal body closer to the support body.

11. The electronic device according to claim 10, wherein the via has a cross-sectional area that is larger than a cross-sectional area of a portion of the electronic component at which the electronic component is mounted on the surface of the first metal body.

12. The electronic device according to claim 1, wherein the functional element substrate is a piezoelectric substrate including at least one of crystal, $LiTaO_3$ $LiNbO_3$, $KNbO_3$, $La_3Ga_5SiO_{14}$, or $Li_2B_4O_7$.

13. The electronic device according to claim 1, wherein the functional element substrate is a compound semiconductor substrate including at least one of GaAs or GaN.

14. An electronic device comprising:

a functional element substrate including a first main surface with a functional element provided thereon, the functional element substrate being a piezoelectric substrate or a compound semiconductor substrate;

a base substrate on which the functional element substrate is mounted such that the first main surface faces the base substrate;

a metal connection body electrically connecting the functional element substrate and the base substrate to each other;

a support body at a second main surface of the functional element substrate opposite to the first main surface, the support body including at least one of a mixture of a metal and a resin, silicon, silicon carbide, boron nitride, aluminum nitride, silicon nitride, copper, or nickel;

a first metal body in contact with the support body, the first metal body including at least a portion extending to outside the functional element substrate in plan view from the support body;

a via connecting the portion of the first metal body outside the functional element substrate and the base substrate to each other, the via including one of a copper-based conductive paste solidified material and a silver-based conductive paste solidified material; and a second metal body between the functional element and the metal connection body; wherein the first metal body extends across the functional element substrate in plan view from the support body;

the portion of the first metal body outside the functional element substrate is located on both sides of opposing sides of the functional element substrate in plan view from the support body;

the portion of the first metal body on the both sides is connected to the base substrate with the via interposed between the portion and the base substrate;

the metal connection body extends from inside the functional element substrate in plan view from the support body to outside the functional element substrate; and the second metal body extends from inside the functional element substrate in plan view from the support body to outside the functional element substrate.

* * * * *